United States Patent
Nasser-Faili et al.

[11] Patent Number: 6,013,191
[45] Date of Patent: Jan. 11, 2000

[54] METHOD OF POLISHING CVD DIAMOND FILMS BY OXYGEN PLASMA

[75] Inventors: Firooz Nasser-Faili, Los Gatos; John A. Herb, Palo Alto; Miguel A. Monreno, Mountain View, all of Calif.

[73] Assignee: Advanced Refractory Technologies, Inc., Buffalo, N.Y.

[21] Appl. No.: 08/958,474

[22] Filed: Oct. 27, 1997

[51] Int. Cl.[7] .................................................. H01L 21/302
[52] U.S. Cl. ............................... 216/67; 216/38; 216/81; 204/192.34
[58] Field of Search .................. 216/38, 67, 81; 204/192.34

[56] References Cited

U.S. PATENT DOCUMENTS

| | | | |
|---|---|---|---|
| 4,957,591 | 9/1990 | Sato et al. | 216/81 |
| 5,334,283 | 8/1994 | Parikh et al. | 216/81 |
| 5,344,526 | 9/1994 | Nishibayashi et al. | 216/81 |
| 5,417,798 | 5/1995 | Nishibayashi et al. | 216/81 |
| 5,458,733 | 10/1995 | Tessmer | 216/67 |

FOREIGN PATENT DOCUMENTS

| | | |
|---|---|---|
| 2281254 | 3/1995 | United Kingdom . |
| 98/15670 | 4/1998 | WIPO . |

OTHER PUBLICATIONS

Lee, D.-G. et al, "Ion–beam polishing of diamond thin films" Mat. Res. Soc. Sump. Proc. vol. 354, pp. 699–703, Jan. 1995.

Llewellyn, I. et al, "Plasma etching and deposition as a method of polishing CVD diamond" SPIE, vol. 2286 Window and Dome Technologies and Materials IV, pp. 198–204, Jul. 1994.

Ilias, S. et al, "Planarization of diamond thin film surfaces by ion beam etching at grazing incidence angle" Diamond and Related Materials, 5, pp. 835–839, Jun. 1996.

Sirineni, G.M.R., et al "Reactive ion etching of diamond as a means of enhancing chemically assisted mechanical polishing efficiency" Diamond Relat. Mater. 6(8) pp. 952–958, Aug. 1997.

Buchkremer–Hermanns, et al., "ECR Plasma Polishing of CVD Diamond Films", 1996, Diamond and Related Materials 5, Elsevier Science S.A., pp. 845–849. Jun. 1996.

Vivensang, et al., "Surface Smoothing of Diamond Membranes by Reactive Ion Etching Process", 1996, Diamond and Related Materials 5, Elsevier Science S.A., pp. 840–844. Jun. 1996.

*Primary Examiner*—Frankie L. Stinson
*Assistant Examiner*—Anita Alanko
*Attorney, Agent, or Firm*—Sierra Patent Group

[57] ABSTRACT

A method for polishing the surface of a diamond film with a low power density plasma in a reactor which comprises disposing $O_2$ gas and a fluorinated gas such as $SF_6$, $NF_3$, and $C_2F_6$ in the reactor, providing power to the reactor so that the power density in the reactor is between about 1.0 watts/cm$^2$ and about 1.1 watts/cm$^2$ for a first duration, and maintaining temperature in the reactor at between about 200° to about 400°. The method may alternatively comprise disposing a sputter gas such as $Ar, O_2$ or $N_2$ in the reactor, providing power to the reactor so that the power density in the reactor is between about 3.0 watts/cm$^2$ and about 7.5 watts/cm$^2$ for a first duration, and performing a sputter etch, disposing $O_2$ gas and a fluorinated gas such as $SF_6$, $NF_3$, and $C_2F_6$ in the reactor, and providing power to the reactor so that the power density in the reactor is between about 1.5 watts/cm$^2$ and about 3.0 watts/cm$^2$ for a second duration.

18 Claims, 5 Drawing Sheets

METHOD OF POLISHING CVD DIAMOND FILMS BY OXYGEN PLASMA

BACKGROUND OF THE INVENTION

1. Field of the Invention

The present invention relates to polishing of CVD diamond film. More particularly, the present invention relates to methods of polishing CVD diamond film by oxygen and a fluorinated gas in both low and high power density plasmas.

2. The Prior Art

Various methods for polishing the diamond surface of an object are well known in the art. For many of the applications in which diamond coated surfaces are employed, the fine polishing of the diamond surface is not only desirable, but it can also be critical. For example, a rough diamond surface on diamond coated tools, such as cutting inserts and round tools, limits the utility of these tools.

The fine polishing of the diamond surface can also be very difficult because the surface is non-planar or is in a complex shape. For example, diamond coated cutting inserts and diamond coated round tools are often non-planar, and diamond domes on the front of aircraft are in a complex shape. The conventional polishing methods used to polish non-planar and complex shapes are expensive and difficult to implement. Conventionally, there are several methods which are used to polish diamond surfaces.

Classic methods use iron wheels and molten metal. In one variation of these methods, the diamond surface is mechanically polished using an iron surface and diamond dust. In another variation of these methods, a heated iron surface and hydrogen are used to create a chemical mechanical polishing action. Both of these methods are limited, however, because the shapes that can be polished are not very complex. These methods also have the undesirable side effect of easily contaminating the diamond surface.

High temperature anneals are also known as a method of polishing diamond. In these high temperature annuals, carbon is diffused from the diamond surface at a high temperature (900° C.) and captured by metal such as Fe or Mn or rare earth metals such as Ce or La.

Electro-chemical methods of polish diamond have also been employed. In one of these methods, the diamond surface is placed in contact with a stabilized ceramic oxide supersonic conductor such as $Y_2O_3:Z_{r_y}O_2$ while placing a potential across the diamond/ceramic surface. The resulting electrochemical action polishes the diamond film surface.

High powered lasers have also been used to planarize and trim diamond surfaces.

None of these known methods are very suitable for polishing diamond surfaces that need to be highly polished and/or have complex, non-planar surfaces. In fact, several of these are very time consuming and expensive methods especially where the materials or surfaces must be replaced to continue polishing. Further, several of these methods are not susceptible to batch processing, because when either at least the size, shape and thickness of the object being polished is changed the polishing method must also be adjusted. Finally, several of this methods result in the contamination of the diamond surface being polished.

Given that the above methods were considered less than satisfactory, attempts were made to polish a diamond film surface by various etching methods, since it was known in the art that diamond can be etched by oxygen in a heated non-plasma environment. Unfortunately, when experiments were conducted to observe whether oxygen etching in a heated environment would be a suitable method for polishing diamond, it was found that this method led to an increase in the surface roughness of the diamond film. Apparently, the heated molecular oxygen attacked the diamond film preferentially at the grain boundaries between the diamond crystals, and led to the formation of needle-like structures (as shown in FIG. 1), rather than the desired smoothening of the diamond film surface.

In an attempt to control the oxygen etch and thereby polish the diamond film, experiments were done with a low power, low density oxygen plasma. As is well known in the art, the reactive ion etching of a substrate occurs due to two different actions. The first action is an anisotropic or directional etch, typically occurring in the vertical direction, and caused by bombardment of ions onto the surface of the diamond substrate. The bombardment is caused either by an induced or applied bias at the surface of the diamond substrate. The second action is an isotropic or non-directional etch, caused by reaction of the reactive chemical species in the plasma with the molecules on the substrate surface.

In the experiments, an attempt was made to control the isotropic and anisotropic etch conditions generated by the plasma at low temperatures to preferentially etch the high points of a diamond film by the known reactive species, oxygen. Unfortunately, though the process conditions were adjusted to control the anisotropic and isotropic etching, the oxygen species which are at least known to etch diamond in a non-plasma environment, showed very little evidence of etching the diamond film.

Clearly, given the inadequacy of the known methods of diamond film surface polishing, and the importance of diamond film surface polishing, there exists a need in the art for additional methods of diamond film polishing.

OBJECTS AND ADVANTAGES OF THE INVENTION

It is therefore an object of the present invention to implement a method for the polishing of a CVD diamond surface that employs other than a mechanical or chemical mechanical polishing action, a high temperature/diffusion anneal process, and electrochemical polishing method or laser trimming method.

It is another object of the present invention to implement a method for polishing CVD diamond which may be used to batch process diamond surfaces of differing shapes and thicknesses.

It is a further object of the present invention to implement a CVD diamond polishing method where non-planer and complex shapes are easily and inexpensively polished.

It is a further object of the present invention to implement a polishing method for CVD diamond surfaces which is essentially non-contact to minimize the surface contamination of the CVD diamond surface.

It is a further advantage of the present invention to implement a method for polishing CVD diamond film which uses large area batch processing techniques to result in lower diamond polishing processing costs.

It is a further object of the present invention to control the isotropic and anisotropic etch mechanisms of a high or low density plasma to polish the surface of a diamond film.

It is a further object of the present invention to implement a method for polishing CVD diamond using a high or low density oxygen and $SF_6$, $CF_4$, $NF_3$, or $C_2F_6$ plasma etch.

It is a further object of the present invention to implement a method for polishing CVD diamond wherein a majority of the surface roughness of a CVD diamond by conventional CVD diamond polishing methods, and wherein the final polishing can be done with a high or low density oxygen and $SF_6$, $CF_4$, $NF_3$, or $C_2F_6$ plasma etch.

BRIEF DESCRIPTION OF THE INVENTION

According to a first aspect of the present invention, the reactor is sealed and evacuated, and $O_2$ at a partial pressure of about 4 to about 400 mTorr and a fluorinated gas such as $SF_6$, $CF_4$, $NF_3$, or $C_2F_6$ at a partial pressure of about 1 to about 110 mTorr are fed into the reactor. The resultant total pressure is about 5 to about 420 mTorr. Preferably a gas mixture including the fluorinated gas at a pressure of about 20% of the total gas pressure is employed. It is contemplated that a total pressure, up to about 1 Torr, with the suggested gas ratios may be employed. Next, power having a density of about 1.0 watts/cm$^2$ and about 1.1 watts/cm$^2$ is supplied to the reactor 5 minutes. During the polishing process, the temperature is stabilized to between about 200° to 400°. Next, the gas ratios and the temperature are maintained, while the power is increased to approximately twice that previously supplied for a duration of about 2 minutes. The power density is about 2.0W/cm$^2$ to about 2.2W/cm$^2$. It is believed that due to an increase in ion bombardment as a result of the increase in the DC bias at the surface of the substrate, additional reaction sites are created on the surface of the diamond film. Next, the reaction conditions of the previous step at the first power density are repeated for a time of approximately 10 minutes. With the additional reaction sites created during the step at the second power density, the surface of the diamond film is polished to a smoother finish.

According to a second aspect of the present invention for a high density plasma, the reactor is sealed and evacuated, and Ar at a pressure of about 5 mTorr to about 50 mTorr is fed into the reactor and a sputter etch is performed at about 600 watts for about two to about eight minutes. Alternatively $O_2$ or $N_2$ may be employed in the sputter etch. The power density in the reactor is between about 3.0 watts/cm$^2$ and about 7.5 watts/cm$^2$. During the polishing process, the temperature is stabilized to between about 200° to 400°. Next, $O_2$ and a fluorinated gas such as $SF_6$, $CF_4$, $NF_3$, or $C_2F_6$ at a total pressure of about 40 mTorr are fed into the reactor, and the power is decreased to 250 watts for about 2 minutes. The partial pressure of the $O_2$ gas is about 35 mTorr and the partial pressure of the fluorinated gas is about 35 mTorr, and the power density is about 1.5 W/cm$^2$ to about 3.0 W/cm$^2$. Preferably, the reaction conditions are repeated about 10 to about 30 times or until the surface is polished as desired.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

According to the present invention, a low or high density plasma reactive ion etching method is employed to polish diamond film surfaces. In the polishing method, an $O_2/(SF_6, CF_4, NF_3,$ or $C_2F_6)$ source gas is excited to a plasma state with RF energy in a capacitively coupled reactor. Within the reactor, the surface of the diamond film is acted on by both chemically reactive ions and energetic ion bombardment. Both types of etching occur because the plasma creates the reactive species and ions, and also induces a bias voltage at the surface of diamond film which propels ions towards the surface of the diamond film. The chemically reactive species arising from the $O_2/(SF_6, CF_4, NF_3,$ or $C_2F_6)$ plasma tend to etch the diamond surface isotropically, while the ions bombarding the surface of the film tend to etch the diamond surface anisotropically. In the present invention, the process conditions, such as power, temperature and pressure are controlled to selectively control the etching due to either the chemically reactive species and/or the ion bombardment to satisfactorily polish a diamond film surface.

Figure 2A:
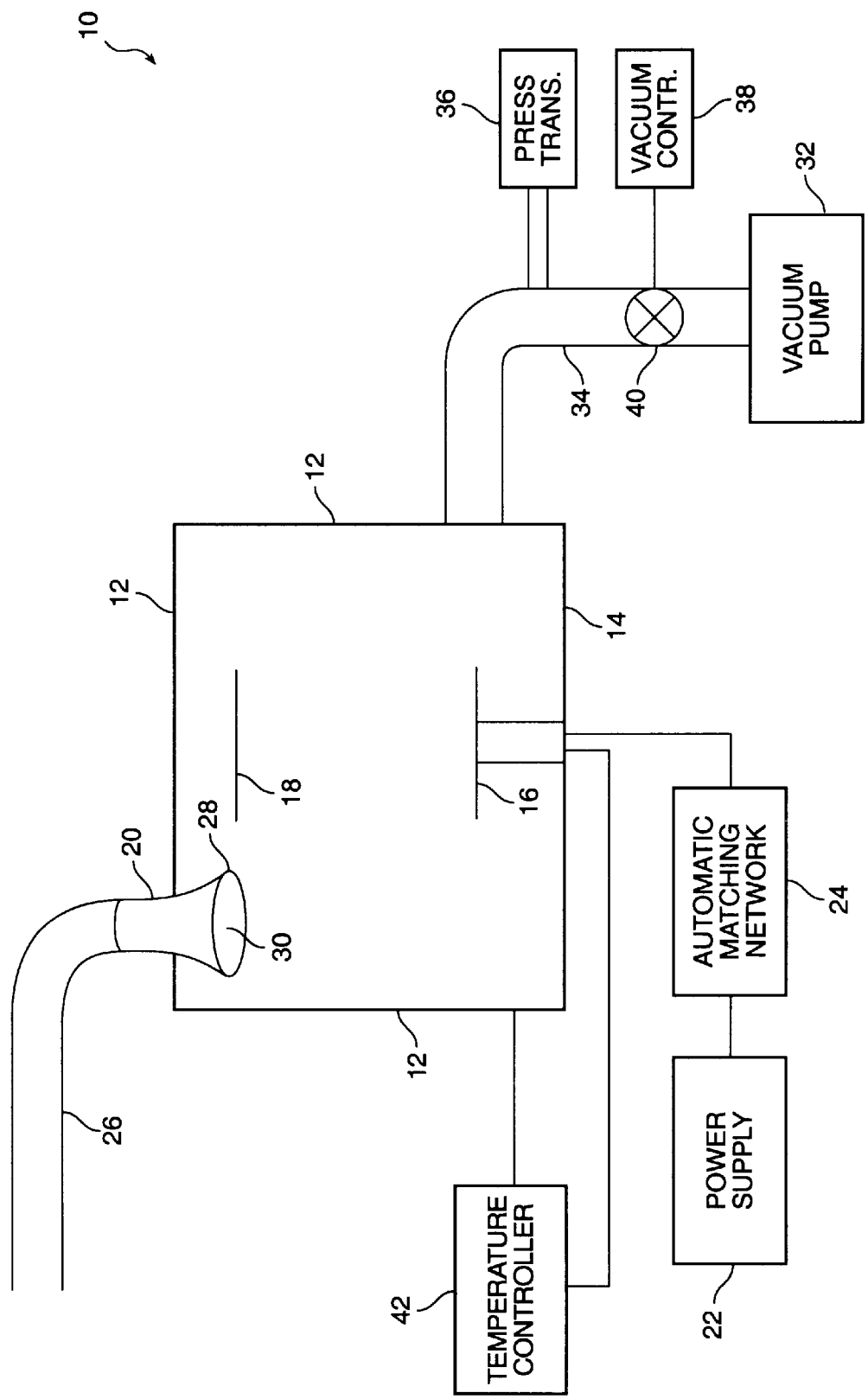
FIG. 2A is a schematic diagram of low power, low density plasma reactor suitable for use according to the present invention.

In FIG. 2A, a schematic diagram of a typical reactive ion etching chamber or reactor 10 suitable for carrying out the process of the present invention is illustrated. To avoid overcomplicating the disclosure and thereby obscuring the present invention, a minimum of the detail of the reactor 10 will be described herein. Further details of a typical reactor 10 are well known to those of ordinary skill in the art. The reactor 10 has an upper housing 12 and lower housing 14 that are fit together and vacuum sealed to form the reactor vessel. Both the upper and lower housing 12 and 14 may be fabricated from metal as is known in the art.

Disposed with the reactor 10 is a sample holder 16. According to the present invention, the diamond film to be polished is placed on the sample holder 16. In addition to holding the diamond substrate, the sample holder 16 also forms the cathode of the reactor 10. The anode of the reactor is typically formed by the metal upper housing 14, but it will also be appreciated that a separate anode 18 may be disposed in the reactor 10 at a distance away from the cathode/sample holder 16. The anode and the upper housing 14 are typically grounded.

A gas inlet 20 in the reactor 10 is employed to introduce the gas into the reactor 10 that will be ionized to form a plasma when power is provided to the reactor 10. Power to the reactor is supplied by a power supply 22 that is connected to an automatic matching network 24. The cathode/sample holder 16 of the reactor 10 receives power from the automatic matching network 24. When power is supplied to the cathode 16, the gas introduced into the reactor 10 by the gas inlet 18 is excited to a plasma state created by a high energy RF field capacitively induced between the cathode 16 and the anode 18 of the reactor 10. It will be appreciated by those of ordinary skill in the art, that once the plasma is ignited, the automatic matching network 24 will adjust itself to match the load created by the plasma.

The gas inlet 20, is typically a portion of a gas delivery system which also includes a line 26 and a plenum 28. The plenum 28 is typically covered by a gas delivery nozzle 30 which may also be grounded to form an anode of the reactor 10. The particular details of the gas delivery system, are well known to those of ordinary skill in the art and will not be disclosed herein to avoid obscuring the present invention. Typically, both the upper and lower housing 12 and 14 forming the reactor vessel and the cathode/substrate holder 16 are connected to thermocouples. In this manner, both the temperature inside the reactor 10 and the temperature of the sample placed on the sample holder 16 can be monitored, and adjusted, if appropriate. Prior to the commencement of the diamond polishing process, reactor 10 is first sealed and then evacuated.

To evacuate the reactor, a vacuum pump 32 communicates with the inside of the reactor 10 via a line 34 which passes through the housing 12. Pressure transducer 36 communicates with line 34 and drives vacuum controller 38, which in turn drives valve 40. Pressure transducer 36, vacuum controller 38 and valve 40 together form a feedback loop in the conventional manner for maintaining a selected level of pressure inside of reactor 10. The thermocouples placed in contact with the substrate holder 16 and the upper and lower housing 12 and 14 are electrically coupled to a temperature controller 42. The feedback loop including the thermocouples and the temperature controller 42 are well known and suitably control a power supply designed to maintain the desired temperature of the sample and the inside of the reactor 10.

Figure 2B:
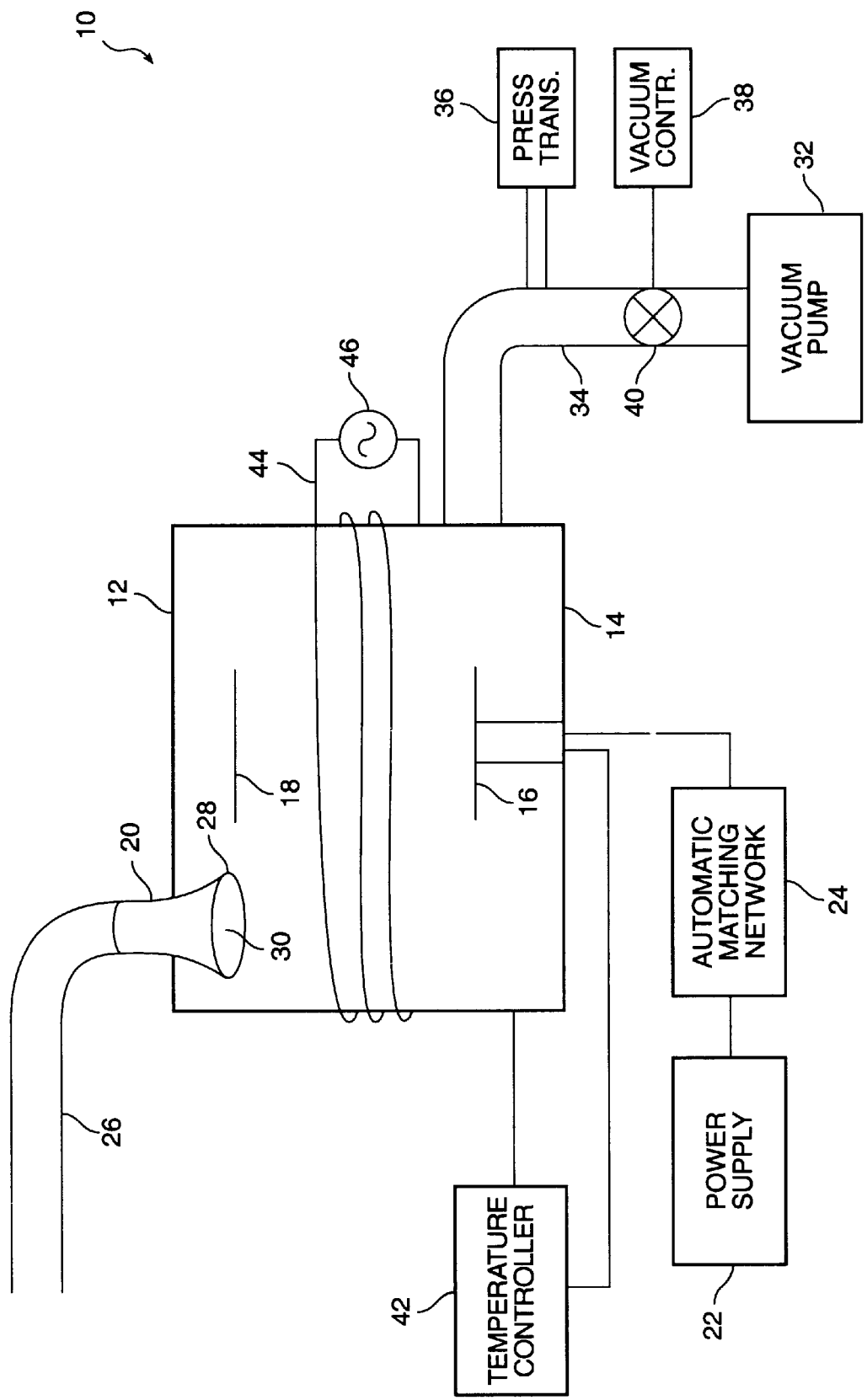
FIG. 2B is a schematic diagram of high power, high density plasma reactor suitable for use according to the present invention.

Other reactor types may also be employed according to the principles of the present invention. These include an inductively coupled plasma reactor, wherein an RF coil is placed outside an insulating reactor housing, and the plasma is induced inside the chamber by induction. According to a second aspect of the invention, a high density plasma is employed to perform the polishing. The reactor 10 described with respect to FIG. 2A, has been modified as shown in FIG. 2B to generate a high density plasma. The reactor 10 is shown with an inductor 44 coupled to current source 46 to generate the high density plasma.

It should be appreciated that the reactors depicted in FIGS. 2A and 2B are only for illustrative purposes. Both low and high density reactors are well known to those of ordinary skill in the art and will not be described in detail herein to avoid obscuring the present invention. Further, in the following embodiments according to the present invention the specific power requirements are given for the reactor employed in the processes set forth. For a different reactor employed according to the present invention, the power applied may be different. However, as will be appreciated by those of ordinary skill in the art, it is the power density in whichever reactor that is employed according to the present invention that should be observed.

Figure 3:
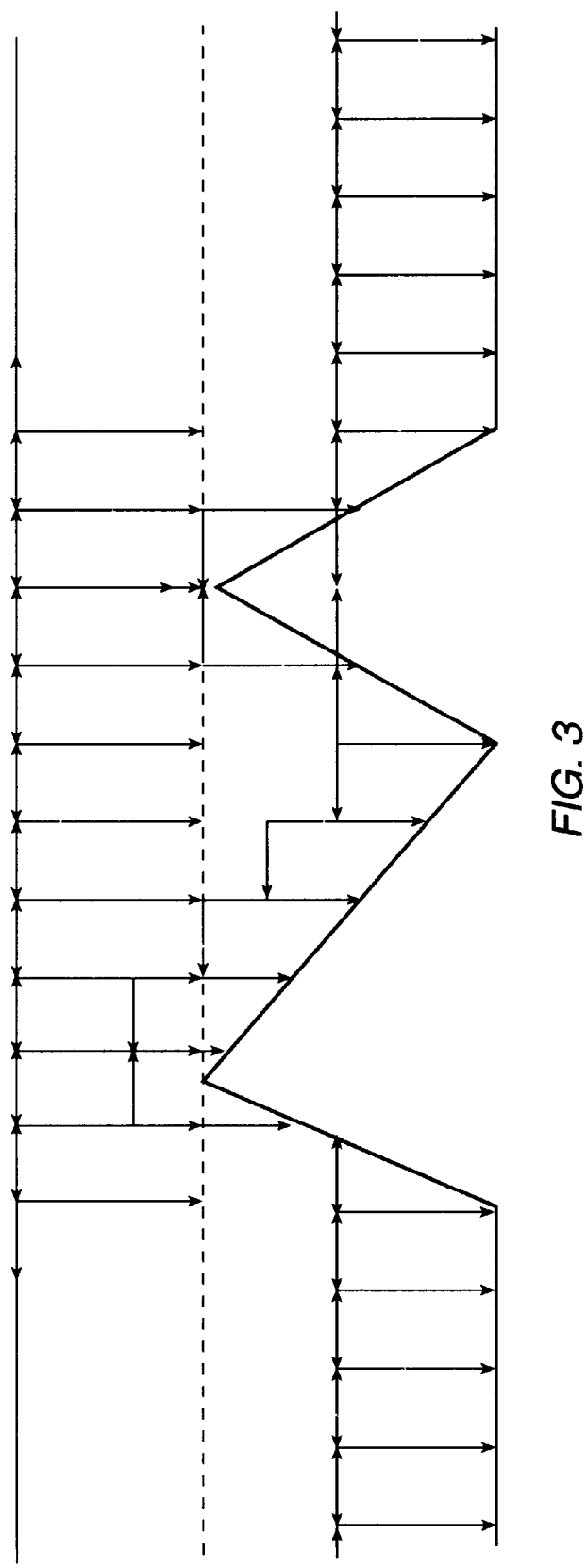
FIG. 3 is a schematic illustration of isotropic and anisotropic diamond peak etching according to the present invention.

When power is applied to the reactor 10, the source gas which introduced into the reactor 10 through the gas inlet 20 is excited by the RF energy into a plasma of both chemically reactive and other ionic species. As a result of the plasma, a DC bias is induced near the sample holder 16 (cathode) on the surface of a diamond substrate. Because of the DC bias at the cathode, the ions in the plasma will bombard the surface of the diamond substrate. It is preferable that the reactive species, however, are allowed to etch in a random motion, so that both horizontal and vertical etching of diamond peaks on the diamond film surface occur as depicted in FIG. 3.

According to the present invention, the plasma conditions are controlled so that the etching of the surface of the diamond film occurs in all directions, and therefore, polishes the film rather than simply replicating the surface already present. According to the first aspect of the present invention employing a low density plasma of an $O_2$ gas and a fluorinated gas, such as $SF_6$, $CF_4$, $NF_3$, or $C_2F_6$, mixture at elevated pressures is employed. Further, the temperature is adjusted to optimize the process conditions. It is contemplated that these process conditions reduced the induced bias at the surface of the cathode, and increased the number of reactive species. According to a second aspect of the present invention, a high density plasma at low pressures with very little or no biasing is employed.

Figure 4A:
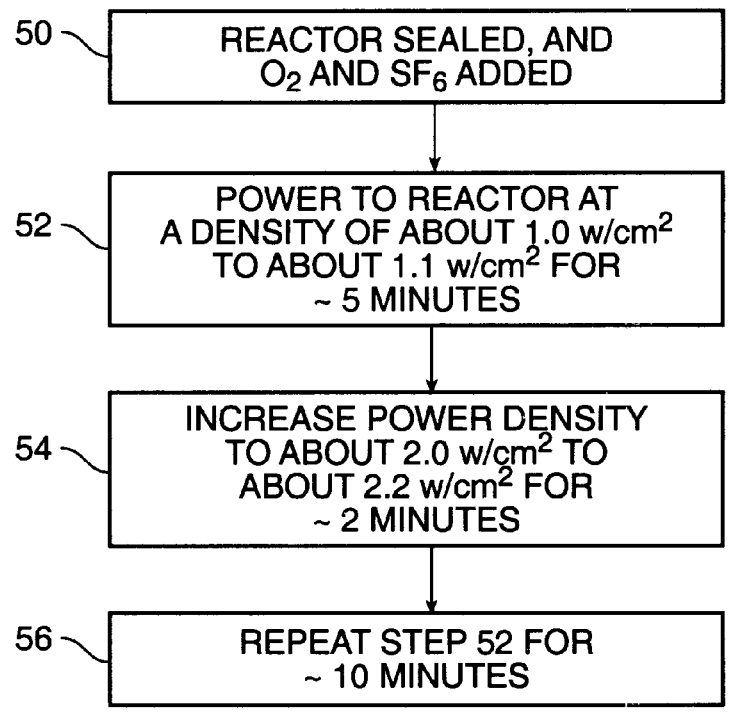
FIG. 4A is a flow diagram according to a first aspect of the present invention.

FIG. 4A illustrates a flow diagram for polishing diamond surfaces according to a first aspect of the present invention for a low density plasma. At step 50, the reactor 10 is sealed and evacuated, and $O_2$ at a partial pressure of about 4 to about 400 mTorr and $SF_6$, at a partial pressure of about 1 to about 110 mTorr are fed into the reactor. The resultant total pressure is about 5 to about 420 mTorr. Alternatively, other fluorinated gases such as $CF_4$, $NF_3$, or $C_2F_6$ may be employed instead of $SF_6$. It was found that satisfactory results were obtained with a gas mixture including $SF_6$ at a pressure of about 20% of the total gas pressure. With a gas mixture including $SF_6$ in an amount substantially below 20%, the formation of needles is observed, and above 20%, the process proceeds at reduced rate. Though the total pressure in the preferred embodiment is approximately about 5 to about 420 mTorr. It is contemplated that a total pressure, up to about 1 Torr, with the suggested gas ratios may be employed.

One of the problems associated with a low pressure, low density plasma reactor is that the number of reactive species is low. It is contemplated that by increasing the pressure of the gas mixture, the number of reactive species is also increased. It is also presently believed that in addition to the increase in the number of reactive species, the charge on the reactive species created is such that the induced bias at the surface of the substrate is also reduced. As a consequence, etching due to ion bombardment is also reduced.

At step 52 power is provided to the reactor 10 preferably in a range of about 60 to about 100 watts, and can be as low as about 50 watts, and as high as about 120 watts. At low power, below 50 watts, relatively little activity was observed. At high power, above 120 watts, the shape of the diamond surface was replicated in the etching process. At about 60 watts, the measured DC bias was approximately −409 volts. It will be appreciated by those of ordinary skill in the art, that the terms low power and high power are relative to the configuration of the reactor employed to perform diamond polishing according to the present invention. Accordingly, as describe above, the power density in the reactor, according to the present invention, is between about 1.0 watts/cm$^2$ and about 1.1 watts/cm$^2$.

During the polishing process, the temperature is stabilized to between about 200° to 400°. Outside of this temperature range, both above and below, a peaked or needle-like surface begins to form again as the graphite at the grain boundaries is selectively etched, rather than the diamond surface.

At step 52, the power is supplied for approximately 5 minutes. The length of time required by the first step of the process may vary somewhat based upon the shape, size and uniformity of the diamond peaks on the diamond film surface. After approximately 5 minutes, it is observed that the diamond film surface does not become any smoother, rather, the diamond film surface is simply replicated.

At step 54 of the polishing process, the gas ratios and the temperature is maintained, while the power is increased to approximately twice that supplied at step 52 for a duration of about 2 minutes. At the increased power level in this step, the DC bias at the surface of the diamond substrate is approximately −656 volts. The power density is about 2.0 W/cm$^2$ to about 2.2 W/cm$^2$. It is believed that due to an increase in ion bombardment as a result of the increase in the DC bias at the surface of the substrate, additional reaction sites are created on the surface of the diamond film.

Figure 1:
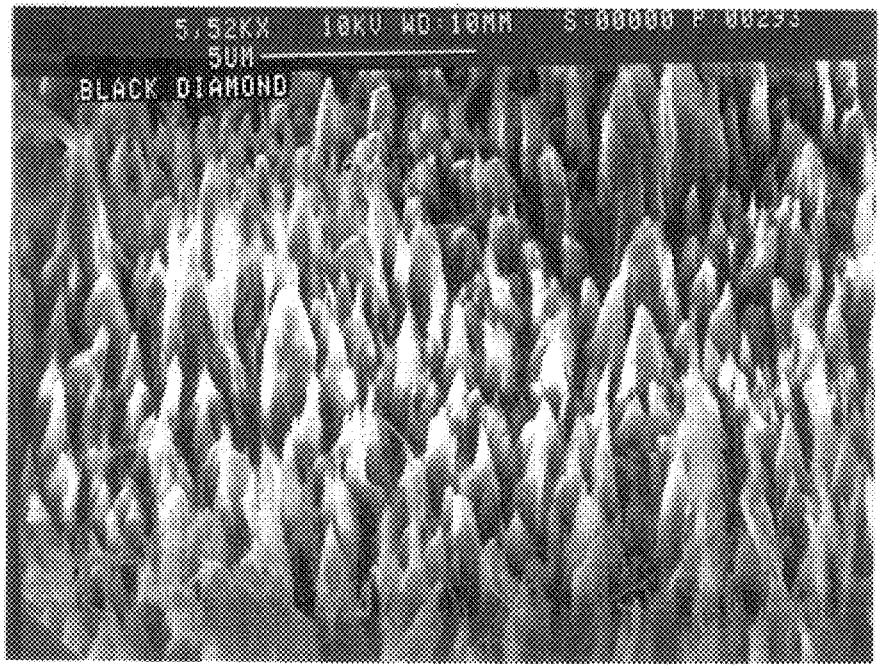
FIG. 1 illustrates the formation of needle-like structures by etching a diamond film with oxygen in a heated non-plasma environment according to the prior art.
Figure 5:
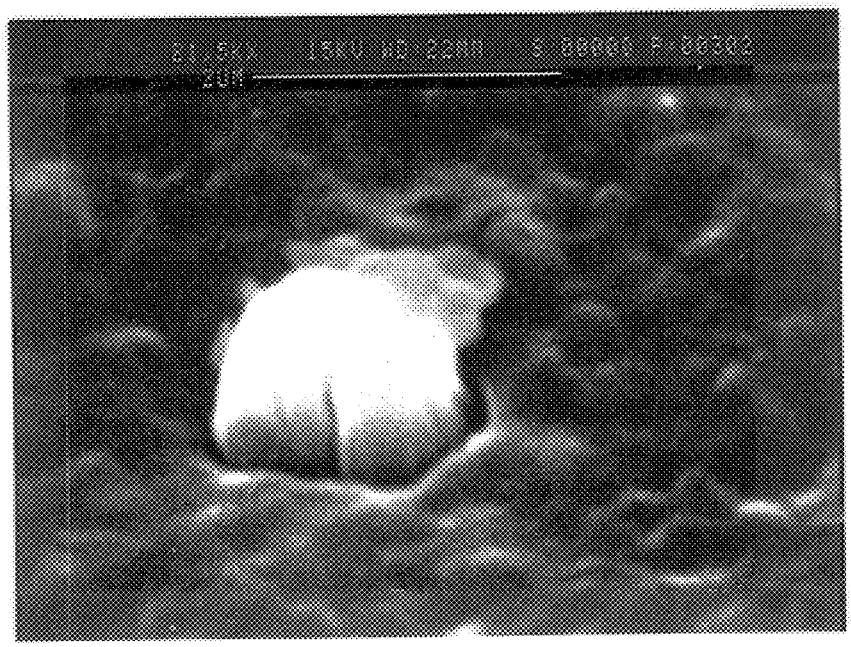
FIG. 5 is a photomicrograph of a diamond surface polished according to polishing process of the present invention.

At step 56, the reaction conditions of step 52 are repeated, though for a time of approximately 10 minutes. With the additional reaction sites created during step 54, the surface of the diamond film was polished at step 56 to a smoother finish than was present after the completion of steps 50 and 52. A photomicrograph of a diamond surface polished according to the present invention following steps 50 through 56 is illustrated in FIG. 5.

In a first alternative embodiment according to the first aspect of the present invention, only steps 50 and 52 of the polishing process are completed, and step 54 employed to create additional reaction sites for further polishing is omitted.

In a second alternative embodiment according to the first aspect of the present invention, it should be appreciated that steps 54 and 56 may be repeated to obtain an even smoother surface. Though after some number of iterations, the surface will not become any smoother, rather, the surface of the diamond film will be replicated.

Figure 4B:
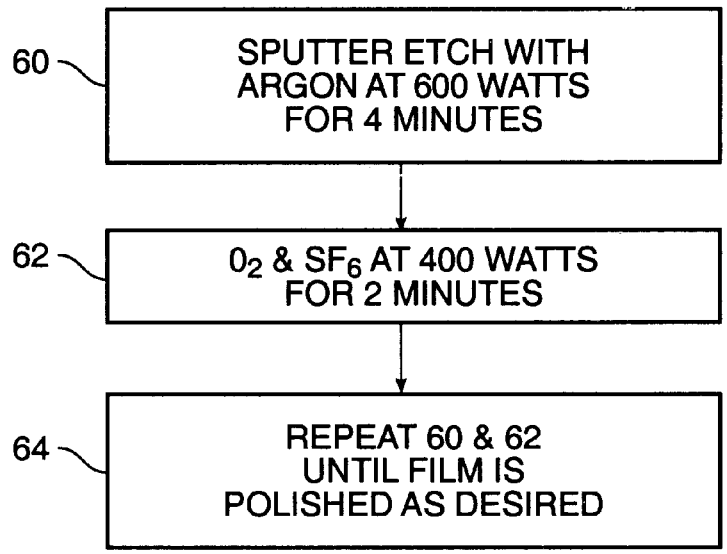
FIG. 4B is a flow diagram according to a first aspect of the present invention.

FIG. 4B illustrates a flow diagram for polishing diamond surfaces according to a second aspect of the present invention for a high density plasma. At step 60, the reactor 10 is sealed and evacuated, and Ar at a pressure of about 5 mTorr to about 50 mTorr, preferably about 25 mTorr, is fed into the reactor and a sputter etch is performed. Alternatively, the sputter etch gases O$_2$ or N$_2$ may be employed instead of Ar. At about 25 mTorr, power is provided to the reactor 10 at about 600 watts for four minutes, while at about 5 mTorr, power is provided to the reactor 10 at about 600 watts for 2 minutes, and at about 50 mTorr, power is provided to the reactor 10 at about 600 watts for 8 minutes. According to the present invention, the power density in the reactor is between about 3.0 watts/cm$^2$ and about 7.5 watts/cm$^2$. During the polishing process, the temperature is stabilized to between about 200° to 400°.

With a high density plasma, the problem of a low number of reactive species in a low pressure, low density plasma reactor is not encountered. A high number of reactive species occurs due to the high density plasma. It is contemplated that during the Argon discharge at step 60 the features of the diamond film are faceted down with a minimum of lateral etching of the material. It is further contemplated at step 60 that due to heavy ion bombardment, additional reaction sites are created on the surface of the diamond film, and pointed and sharp peaks are rounded by the high bombardment dose due to intense field effects.

At step 62, the reactor 10 is sealed and evacuated, O$_2$ and SF$_6$ at a pressure of about 40 mTorr are fed into the reactor, and the power is decreased to 250 watts for about 2 minutes. The power density is about 1.5 W/cm$^2$ to about 3.0 W/cm$^2$. At step 62, O$_2$ is at a partial pressure of about 35 mTorr and SF$_6$ is at a partial pressure of about 5 mTorr are fed into the reactor. Alternatively, a fluorinated gas such as CF$_4$, NF$_3$, or C$_2$F$_6$ may be employed instead of SF$_6$.

During the O$_2$ and SF$_6$ discharge at step 62, the diamond film is etched isotropically, and it is contemplated that the surface of the diamond film is contoured by a reduction in the peak-to-peak differential which occurs by undercutting the surface features of the diamond film. It is contemplated that this is achieved by the semispherical distribution of the etching species.

At step 64, the reaction conditions of steps 60 and 62 are preferably repeated about 10 to about 30 times or until the surface is polished as desired.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for polishing the surface of a diamond film with a low power density plasma in a reactor comprising the steps of:

bombarding the surface of said diamond film with ions from a plasma of an O$_2$ and fluorinated gas mixture at a first power density to form reaction sites; and reacting the surface of said diamond film with ions from a plasma of an O$_2$ and fluorinated gas mixture at a second power density, said second power density being less than said first power density, to smooth the surface of said diamond film.

2. A method for polishing the surface of a diamond film with a high power density plasma in a reactor comprising the steps of:

bombarding the surface of said diamond film with ions from a plasma of a sputter etch gas selected from the group consisting of Ar, O$_2$ and N$_2$ at a first power density to form reaction sites; and reacting the surface of said diamond film with ions from a plasma of an O$_2$ and fluorinated gas mixture at a second power density, said second power density being less than said first power density, to smooth the surface of said diamond film.

3. A method for polishing the surface of a diamond film with a low power density plasma in a reactor comprising the steps of:

disposing O$_2$ gas and a fluorinated gas selected from the group consisting of SF$_6$, NF$_3$, and C$_2$F$_6$ in a reactor;

providing power to the reactor so that the power density in the reactor is between about 1.0 watts/cm2 and about 1.1 watts/cm2 for a first duration; and providing power to the reactor so that the power density in the reactor is between about 2.0 watts/cm2 and about 2.2 watts/cm2 for a second duration.

4. The method for polishing the surface of a diamond film as in claim 3 further including the step of maintaining temperature in the reactor at between about 200° to about 400°.

5. The method for polishing the surface of a diamond film as in claim 3 wherein said first duration is about 5 minutes.

6. The method for polishing the surface of a diamond film as in claim 3 wherein partial pressure of O$_2$ in the reactor is about 4 to about 400 mTorr and partial pressure of said fluorinated gas in the reactor is about 1 to about 110 mTorr.

7. The method for polishing the surface of a diamond film as in claim 3 wherein total gas pressure of said gases O$_2$ and SF$_6$ in the reactor is about 5 to about 420 mTorr.

8. The method for polishing the surface of a diamond film as in claim 3 wherein partial pressure SF$_6$ is about 20% of total gas pressure.

9. The method for polishing the surface of a diamond film as in claim 3 wherein said second duration is about 2 minutes.

10. The method of polishing the surface of a diamond as in claim 3 further including the step of providing power to the reactor so that the power density in the reactor is between about 1.0 watts/cm$^2$ and about 1.1 watts/cm$^2$ for a third duration.

11. The method for polishing the surface of a diamond film as in claim 10 wherein said third duration is about 10 minutes.

12. A method for polishing the surface of a diamond film with a high power density plasma in a reactor comprising the steps of:

disposing a sputter etch gas selected from the group consisting of Ar, O$_2$ and N$_2$ in the reactor;

providing power to the reactor so that the power density in the reactor is between about 3.0 watts/cm$^2$ and about 7.5 watts/cm$^2$ for a first duration, and performing a sputter etch;

disposing gases O$_2$ and a fluorinated gas selected from the group consisting of SF$_6$, CF$_4$, NF$_3$, and C$_2$F$_6$ in the reactor;

providing power to the reactor so that the power density in the reactor is between about 1.5 watts/cm$^2$ and about 3.0 watts/cm$^2$ for a second duration.

13. The method for polishing the surface of a diamond film as in claim 12 further including the step of maintaining temperature in the reactor at between about 200° to about 400°.

14. The method for polishing the surface of a diamond film as in claim 12 wherein said first duration is about 4 minutes.

15. The method for polishing the surface of a diamond film as in claim 12 wherein said second duration is about 2 minutes.

16. The method for polishing the surface of a diamond film as in claim 12 wherein pressure of said sputter etch gas is about 5 mTorr to about 50 mTorr.

17. The method for polishing the surface of a diamond film as in claim 12 wherein partial pressure of O$_2$ in the reactor is about 35 mTorr and partial pressure of said fluorinated gas is about in the reactor is about 5 mTorr.

18. The method for polishing the surface of a diamond film as in claim 12 wherein total gas pressure of said O$_2$ gas and said fluorinated gas in the reactor is about 40 mTorr.

* * * * *